United States Patent
Hasegawa et al.

(10) Patent No.: US 9,345,138 B2
(45) Date of Patent: May 17, 2016

(54) LAMINATED SUBSTRATE AND METHOD OF MANUFACTURING LAMINATED SUBSTRATE

(71) Applicant: FUJITSU LIMITED, Kawasaki-shi, Kanagawa (JP)

(72) Inventors: Takumi Hasegawa, Suzaka (JP); Hidehiko Fujisaki, Nagano (JP)

(73) Assignee: FUJITSU LIMITED, Kawasaki (JP)

( * ) Notice: Subject to any disclaimer, the term of this patent is extended or adjusted under 35 U.S.C. 154(b) by 51 days.

(21) Appl. No.: 14/470,022

(22) Filed: Aug. 27, 2014

(65) Prior Publication Data

US 2015/0156874 A1 Jun. 4, 2015

(30) Foreign Application Priority Data

Nov. 29, 2013 (JP) ................................. 2013-248351

(51) Int. Cl.
| | |
|---|---|
| H05K 1/14 | (2006.01) |
| H05K 3/00 | (2006.01) |
| H05K 1/11 | (2006.01) |
| H05K 3/32 | (2006.01) |
| H05K 3/42 | (2006.01) |
| H05K 3/46 | (2006.01) |

(52) U.S. Cl.
CPC ............... *H05K 1/115* (2013.01); *H05K 3/325* (2013.01); *H05K 3/427* (2013.01); *H05K 3/4623* (2013.01); *H05K 2201/096* (2013.01); *H05K 2201/1059* (2013.01); *H05K 2203/061* (2013.01); *Y10T 156/1064* (2015.01)

(58) Field of Classification Search
CPC ..................................................... H05K 3/4635
See application file for complete search history.

(56) References Cited

U.S. PATENT DOCUMENTS

| | | | |
|---|---|---|---|
| 2006/0046471 A1* | 3/2006 | Kirby ................ | H01L 21/76898 438/638 |
| 2007/0176250 A1* | 8/2007 | Lee ...................... | H03H 9/1092 257/416 |

FOREIGN PATENT DOCUMENTS

| | | |
|---|---|---|
| JP | 04-243197 A | 8/1992 |
| JP | 05-347480 A | 12/1993 |
| JP | 2000-077809 A | 3/2000 |
| JP | 2004-047795 A | 2/2004 |

\* cited by examiner

*Primary Examiner* — Stephen W Smoot
(74) *Attorney, Agent, or Firm* — Squire Patton Boggs (US) LLP

(57) ABSTRACT

A method of manufacturing a laminated substrate, the method includes: forming a first diameter hole to a first surface of a first substrate so as not to penetrate the first substrate; forming a second diameter hole to a second surface of the first substrate so as to communicate with the first diameter hole; plating the first substrate to block the second diameter hole without blocking the first diameter hole; and laminating a second substrate on the second surface of the first substrate.

16 Claims, 6 Drawing Sheets

LAMINATED SUBSTRATE AND METHOD OF MANUFACTURING LAMINATED SUBSTRATE

CROSS-REFERENCE TO RELATED APPLICATION

This application is based upon and claims the benefit of priority from the prior Japanese Patent Application No. 2013-248351 filed on Nov. 29, 2013, the entire contents of which are incorporated herein by reference.

FIELD

The embodiments discussed herein are related to a manufacturing method of a laminated substrate and a laminated substrate.

BACKGROUND

A multi-layered printed wiring board is used as a laminated substrate.

Related techniques are disclosed in Japanese Laid-Open Patent Publication Nos. 4-243197, 5-347480, and 2000-77809.

SUMMARY

A method of manufacturing a laminated substrate, the method includes: forming a first diameter hole to a first surface of a first substrate so as not to penetrate the first substrate; forming a second diameter hole to a second surface of the first substrate so as to communicate with the first diameter hole; plating the first substrate to block the second diameter hole without blocking the first diameter hole; and laminating a second substrate on the second surface of the first substrate.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

A multi-layered printed wiring board includes a structure in which plating is performed on inner surfaces of a large diameter hole and a small diameter hole which are communicated with each other.

A printed wiring board may be used with a tapered through hole which is sealed by a plating metal.

For example, when a portion of a through hole is blocked by plating in a laminated substrate in which a plurality of substrates (element substrates) is laminated, a circuit pattern using a metal film may be finely formed when the metal film formed on the substrate by the plating is thin.

Figure 1A:
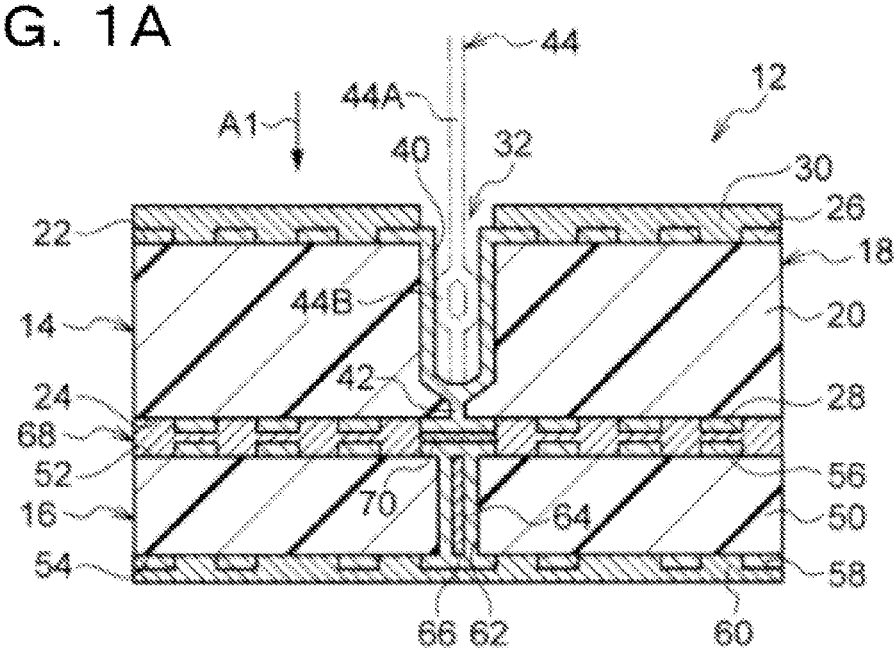
FIGS. 1A and 1B illustrate an exemplary laminated substrate.
Figure 1B:
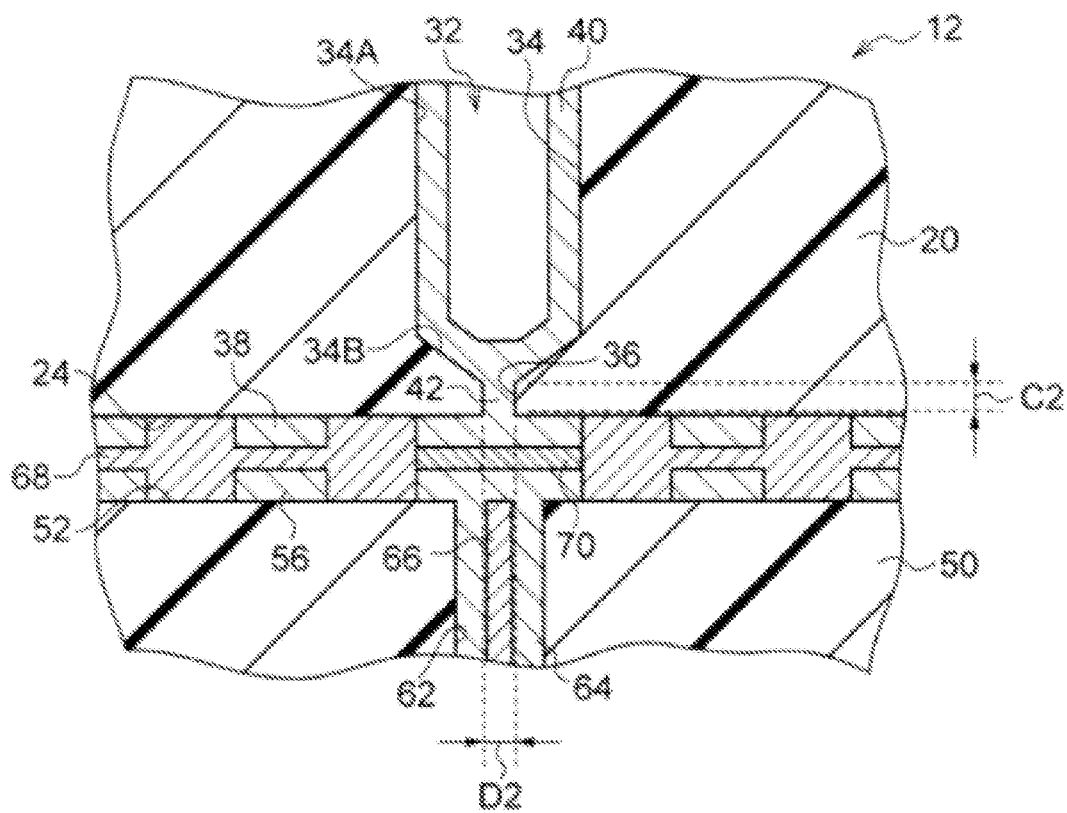

FIGS. 1A and 1B illustrate an exemplary laminated substrate. FIG. 1A illustrates an enlarged cross-sectional view of the laminated substrate. FIG. 1B illustrates an enlarged cross-sectional view of the laminated substrate in a scale larger than that of FIG. 1A. FIGS. 2A to 2I illustrate an exemplary method of manufacturing a laminated substrate.

A laminated substrate 12 illustrated in FIG. 1A includes a first substrate 14 and a second substrate 16. Each of the first substrate 14 and the second substrate 16 may be, for example, a single-layered substrate. Any one or both of the first substrate 14 and the second substrate 16 may be, for example, a multi-layered substrate. The first substrate 14 may be a portion of the laminated substrate 12 or may be used alone as a substrate of a single layer (a single-layered substrate 18)

The first substrate 14 has a base material 20 formed of an insulative material such as epoxy resin, phenol resin or the like. A wiring pattern 26 or 28 is formed on each of a first surface 22 which is one surface of the base material 20 and a second surface 24 which is the other surface thereof. A further outer side (an upper side in FIG. 1A) of the wiring pattern 26 on the first surface 22 of the first substrate 14 is coated with an insulative coating layer 30.

Figure 2A:
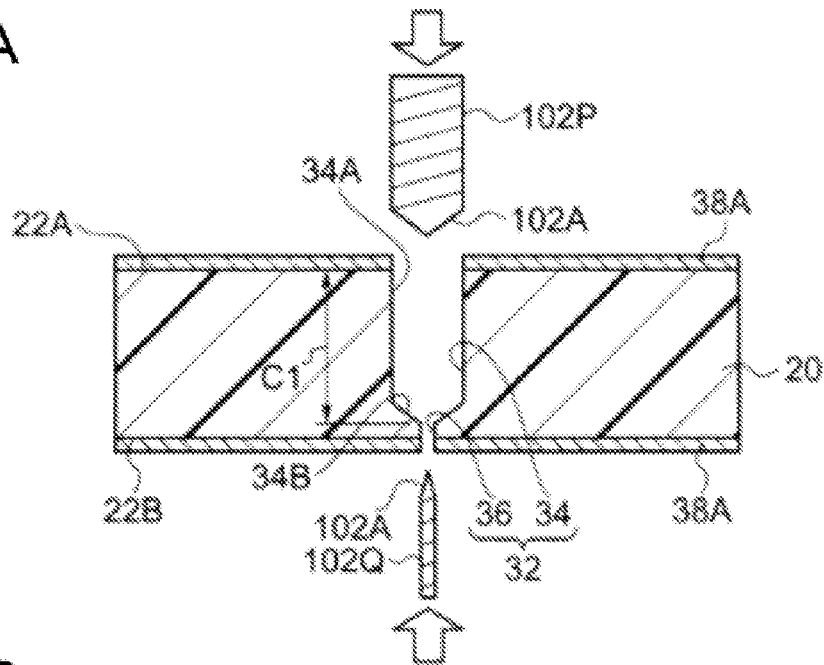
FIGS. 2A to 2I illustrate an exemplary method of manufacturing a laminated substrate.

As also illustrated in FIG. 2A, a through hole 32 penetrating the base member 20 in a thickness direction of the plate is formed in the base material 20 of the first substrate 14. Even though one through hole is provided in a portion illustrated in FIGS. 1A and 2A, one or a plurality of through holes 32 may be formed in the entire first substrate 14.

The through hole 32 has a large diameter hole 34 and a small diameter hole 36 having a smaller diameter than that of the large diameter hole 34. The large diameter hole 34 is formed at the first surface 22 side of the base material 20. The large diameter hole 34 may be formed to have a depth which does not reach the second surface 24. A depth C1 of the large diameter hole 34 may be determined in consideration of a relationship with an inner diameter D2 of the small diameter hole 36.

The small diameter hole 36 is formed at the second surface 24 side of the first substrate 14. Since the small diameter hole 36 communicates with the large diameter hole 34, the large diameter hole 34 and the small diameter hole 36 penetrate through the first substrate 14.

The large diameter hole 34 includes a cylindrical portion 34A, which is positioned at the first surface 22 side and has a substantially constant diameter, and a conical portion 34B, which extends continuously from the cylindrical portion 34A and has an inner diameter which is gradually reduced toward the second surface 24.

The small diameter hole 36 is a hole having a circular cross-section in the horizontal direction with the diameter smaller than that of the conical portion 34B of the large diameter hole 34. The center of the large diameter hole 34 and the center of the small diameter hole 36 may be substantially coincident with each other. As illustrated in FIG. 1B, the inner diameter of the small diameter hole 36 may be D2 and the depth thereof may be C2. The depth C2 of the small diameter hole 36 may be determined depending on the depth C1 of the large diameter hole 34 and the inner diameter D2 of the small diameter hole 36. For example, when the large diameter hole 34 is formed to be deeper, the depth of the small diameter hole 36 may be reduced by that amount. Since the large diameter hole 34 has the conical portion 34B, when the inner diameter D2 of the small diameter hole 36 is set to be larger, the depth C2 of the small diameter hole 36 is also increased correspondingly.

Plating is performed on the first surface 22 and the second surface 24 of the first substrate 14, the small diameter hole 36, and the large diameter hole 34. On the first surface 22 and the second surface 24, patterning is performed on a metal film 38 (see FIG. 2B) formed by the plating so as to form wiring patterns 26 and 28. Copper may be used as a metal for the plating. A coating portion 40 is formed in the large diameter hole 34 by the plating. The coating portion 40 covers the inner surface of the large diameter hole 34. A blocking portion 42 is formed in the small diameter hole 36 by the plating. The blocking portion 42 blocks the small diameter hole 36. For example, the through hole 32 of the base material 20 may be blocked at the second surface 24 side (one surface side). The through hole 32 may be blocked only at the second surface 24 side (the one surface side).

As illustrated in FIG. 1A, a connector 44 may be inserted into the large diameter hole 34 from the first surface 22 side. In FIG. 1A, the connector 44 includes a rod shaped or a plate-shaped body portion 44A and a wide-width portion 44B in which the body portion 44A is partially widened. The wide-width portion 44B comes in close contact with the coating portion 40 of the cylindrical portion 34A of the large diameter hole 34 from the inner side. Since the wide-width portion 44B comes in close contact with the coating portion 40 in the large diameter hole 34, the connector 44 and the coating portion 40 are electrically coupled to each other and the connector 44 is fixed to the large diameter hole 34 so as not to be loosened therefrom. For example, the connector 44 may be maintained to be electrically coupled to the first substrate 14 without using solder or an adhesive. Since no solder is used when the connector 44 is coupled to the first substrate 14, a heat source for melting the solder is not necessary and thus the connector 44 may be coupled to the first substrate 14 with reduced energy.

The wide-width portion 44B may have a structure which is wider than the inner diameter of the large diameter hole 34 in a state before being inserted into the large diameter hole 34 and is press-fitted into the large diameter hole 34. The wide-width portion 44B may have a structure which is narrower than the inner diameter of the large diameter hole 34 in a state before being inserted into the large diameter hole 34 and then becomes wider after being inserted into the large diameter hole 34 so as to be closely attached to the coating portion 40 of the cylindrical portion 34A from the inside. In any structure, a contact state with the coating portion 40 may be maintained by an elastic restoring force (force to be widened) of the wide-width portion 44B in the large diameter hole 34.

As illustrated in FIG. 1A, the second substrate 16 may have a base material 50 which is formed of an insulative material, for example, epoxy resin or phenol resin. The material of the second substrate 16 may be the same as or different from the material of the first substrate. Wiring patterns 56 and 58 are formed on the first surface 52 which is one surface of the base material 50 and the second surface 54 which is the other surface of the base material 50. A further outer side of the wiring pattern 58 on the second surface 54 of the second substrate 16 is coated with an insulative coating layer 60.

A through hole 62 is formed in the base material 50 of the second substrate 16. A coating portion 64 is formed in the through hole 62 by the plating. The coating portion 64 covers the inner surface of the through hole 62. The coating portion 64 electrically couples a portion of the wiring pattern 56 of the first surface 52 to a portion of the wiring pattern 58 of the second surface 54. An insulative filler 66 is filled inside the coating portion 64 of the through hole 62.

The first substrate 14 and the second substrate 16 are bonded by an adhesive sheet 68 to be integrated with each other. The adhesive sheet 68 may be formed from a flexible insulative material, for example, a resin, in a film shape. As illustrated in FIGS. 1A and 1B, the adhesive sheet 68 may be partially depressed in accordance with shapes of the wiring pattern 28 of the second surface 24 of the first substrate 14 and the wiring pattern 56 of the first surface 52 of the second substrate 16. Since the adhesive sheet 68 is depressed as described above, the adhesive sheet 68 may come in close contact with the second surface 24 of the first substrate 14 or the first surface 52 of the second substrate 16 at a location where the wiring pattern 28 or 56 is not formed.

A conductive material 70 is buried in the adhesive sheet 68. The conductive material 70 electrically couples a portion of the wiring patterns 56 and 58 on the second surface 24 of the first substrate 14 and a portion of the wiring patterns 56 and 58 on the first surface 22 of the second substrate 16 in a state where the adhesive sheet 68 is in contact with the first substrate 14 and the second substrate 16.

In FIGS. 1A and 1B, the center of the small diameter hole 36 (the large diameter hole 34) of the first substrate 14 may be substantially coincident with the center of the through hole 32 of the second substrate 16 when viewed from a normal direction (an arrow A1 direction) of the laminated substrate 12. The conductive material 70 is disposed between the small diameter hole 36 and the through hole 32. Instead of the conductive material 70, the adhesive sheet 68 may be disposed immediately below the small diameter hole 36. Since the small diameter hole 36 is blocked by the blocking portion 42, the adhesive sheet 68 or the conductive material 70 may be suppressed from being inadvertently inserted into the small diameter hole 36 or deformed.

In FIG. 1A, the laminated substrate 12 has a double-layered structure having the first substrate 14 and the second substrate 16 but the laminated substrate may have a triple or more-layered structure. In a laminated substrate having the triple or more-layered structure, a substrate may be laminated on the bottom side of the second substrate 16 illustrated in FIG. 1A, for example.

FIGS. 2A to 2I illustrate an exemplary method of manufacturing a laminated substrate.

When a laminated substrate 12 is manufactured, as illustrated in FIG. 2A, a large diameter hole 34 is formed in the base material 20 of the first substrate 14 from the first surface 22 side and a small diameter hole 36 is formed in the base material 20 of the first substrate 14 from the second surface 24 side. The large diameter hole 34 and the small diameter hole 36 may be formed, for example, using a drill 102P or 102Q. When the drill is used, a tip end of the drill 102P or 102Q has an inclined portion 102A so that the large diameter hole 34 having the cylindrical portion 34A and the conical portion 34B may be easily formed by the drill. For example, the large diameter hole 34 and the small diameter hole 36 may be formed by irradiating laser. An order of forming the large diameter hole 34 and the small diameter hole 36 is arbitrarily determined.

In FIG. 2A, a metal film 38A is formed on the first surface 22 and the second surface 24 of the first substrate 14 before forming the large diameter hole 34 and the small diameter hole 36. However, the metal film 38A may not be formed.

Figure 2B:
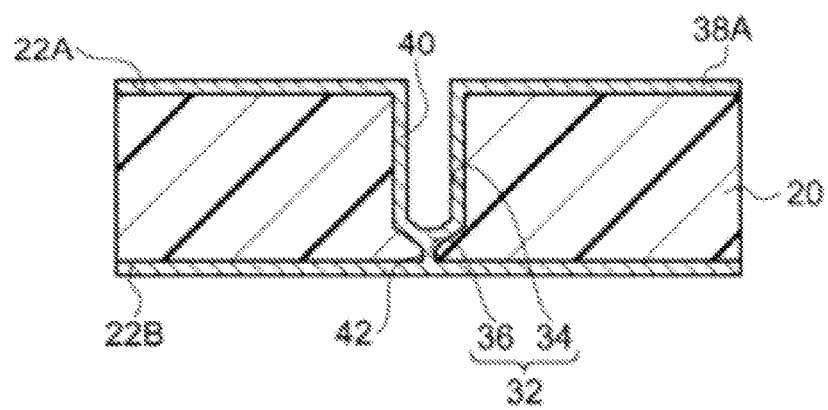

As illustrated in FIG. 2B, plating is performed on the first substrate 14. A plating method may be arbitrarily selected. For example, a method of injecting plating liquid from a nozzle to be coated on the base material 20 may be used. When the method of injecting the plating liquid onto the base material 20 is used, a flow rate of the plating liquid is fast on the surface (the first surface 22 and the second surface 24) of the base material 20, but the plating liquid is hard to be introduced into the small diameter hole 36 so that the flow rate thereof may be slower.

As described above, when it is anticipated that the flow rate of the plating liquid on the surface of the base material 20 and the flow rate in the inside of the small diameter hole 36 are different from each other, an inhibitor or a promoter may be used. When an inhibitor having a high molecular weight (polymer inhibitor) is used as the inhibitor, the inhibitor is hard to be introduced into the small diameter hole 36 so that an effect of suppressing the formation of a plating film may be relatively high on the surface of the base material 20. When a promoter having a low molecular weight is used as the promoter, the promoter is easily introduced into the small diameter hole 36 so that growth of the plating film in the small diameter hole 36 may be promoted.

Plating on the base material 20 may be performed without blocking the large diameter hole 34 until a metal for plating blocks the small diameter hole 36. For example, the small diameter hole 36 is blocked by the blocking portion 42 by the plating. A coating portion 40 is formed in the large diameter hole 34. A metal film 38 is also formed on the first surface 22 and the second surface 24 of the first substrate 14. For example, when the metal film 38A has been already formed on the first surface 22 and the second surface 24, the thickness of the film may be increased.

The blocking portion 42, the coating portion 40, and the metal film 38 may be formed by performing the plating on the first substrate 14 one time. The "one-time plating" may mean that the metal film 38 which is being processed or formed on the base material 20 is not processed or treated during the plating process. Therefore, the "one-time plating" may include a plating method in which the formation of the metal film on the base material 20, for example, the spraying of the plating liquid is performed plural times.

Figure 2C:
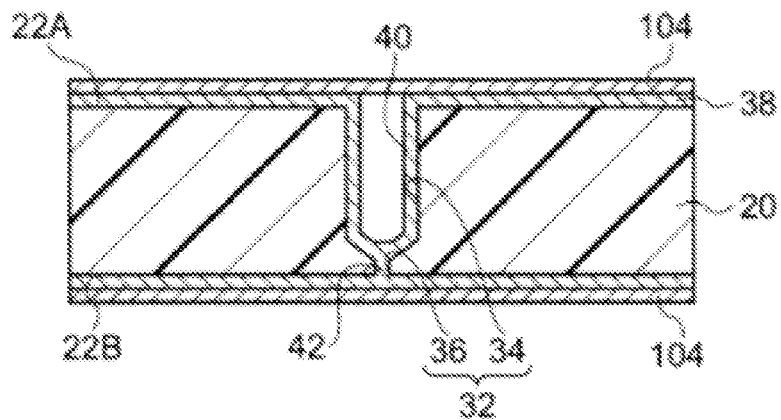

As illustrated in FIG. 2C, a dry film resist 104 is laminated on the metal film 38. The dry film resist 104 covers an opened portion of the large diameter hole 34 at the first surface 22 side.

Figure 2D:
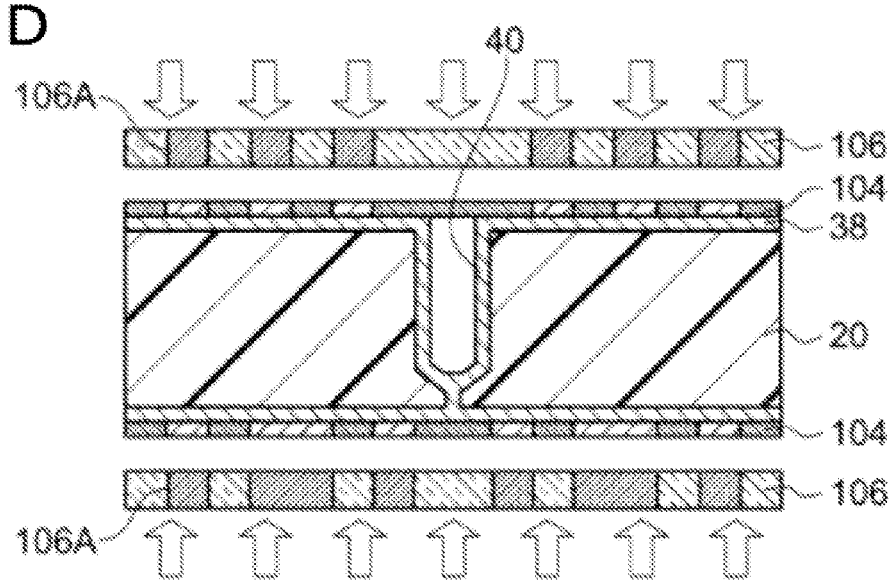

As illustrated in FIG. 2D, a glass mask 106 is disposed for each of the dry film resist 104 of the first surface 22 side and the dry film resist 104 of the second surface 24 side, and the dry film resist 104 is exposed from the first surface 22 side and the second surface 24 side using ultraviolet rays. A transmissive pattern 106A is formed on the glass mask 106 to transmit the ultraviolet rays based on the wiring pattern 26 or 28.

Figure 2E:
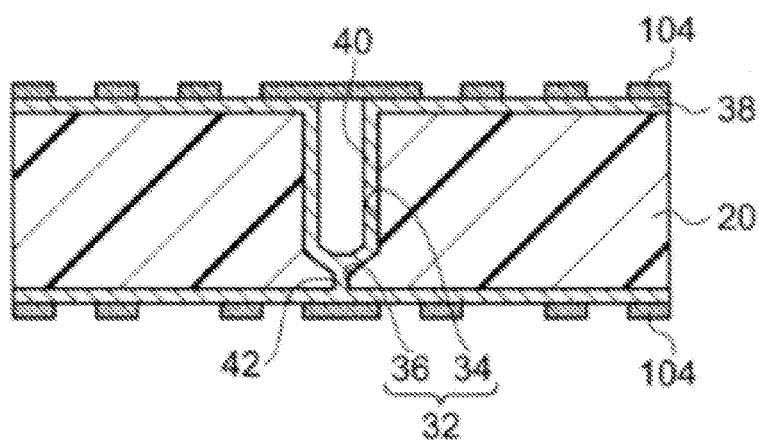

When the dry film resist 104 is developed after exposing the dry film resist 104 as illustrated in FIG. 2E, the dry film resist 104 of a portion irradiated by the ultraviolet rays is not removed but a portion of the dry film resist 104 to which the ultraviolet rays are not irradiated is removed. For example, the dry film resist 104 covers the metal film 38 along the shapes of the wiring patterns 26 and 28.

Figure 2F:
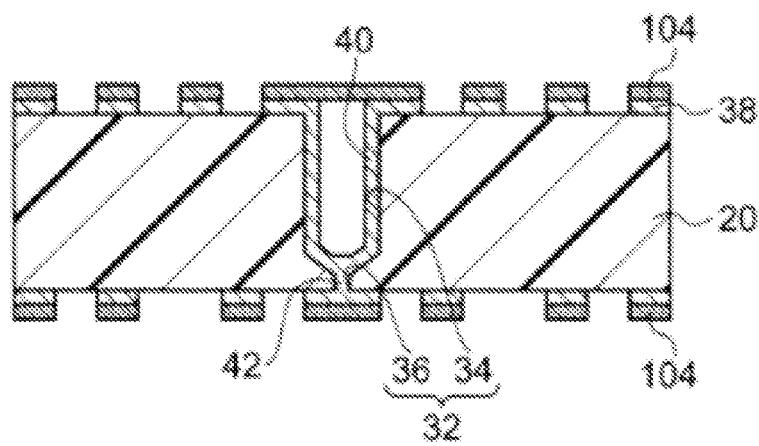

As illustrated in FIG. 2F, when the metal film 38 is etched, the metal film 38 uncovered by the dry film resist 104 is removed from the first substrate 14. Since the dry film resist 104 covers an opening portion of the large diameter hole 34 at the first surface 22 side and a portion of the small diameter hole 36 at the second surface 24 side, the coating portion 40 or the blocking portion 42 is not removed inadvertently.

Figure 2G:
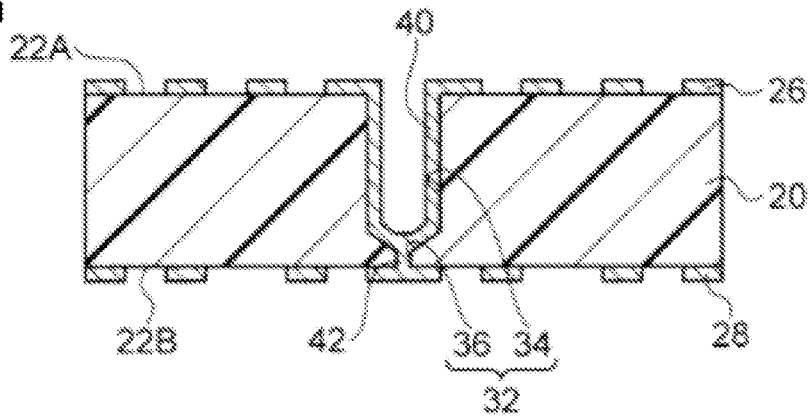

As illustrated in FIG. 2G, by peeling off the dry film resist 104, the wiring pattern 26 is formed on the first surface 22 of the first substrate 14 and the wiring pattern 28 is formed on the second surface 24.

Figure 2H:
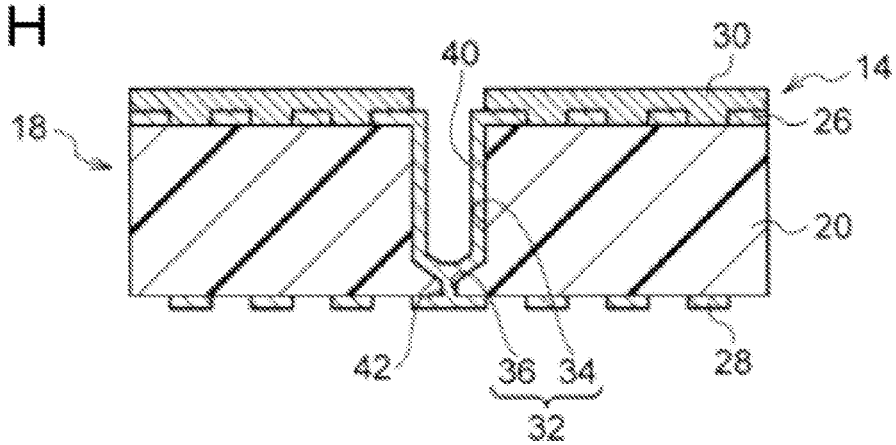

As illustrated in FIG. 2H, a coating layer 30 is formed on the first surface 22 so as to protect the wiring pattern 26 on the first surface 22. The first substrate 14 may be obtained as described above. The formation of the coating layer 30 may be performed after the first substrate 14 and the second substrate 16 are laminated. When the first substrate 14 is used as a single-layered substrate 18, for example, the coating layer 30 may also be formed on the second surface 24 to protect the wiring pattern 28.

The second substrate 16 (see FIG. 1A) may also be manufactured simultaneously with the first substrate 14 or before or after the first substrate 14. For example, a through hole 62 is formed in the base material 20 of the second substrate 16, the wiring patterns 56 and 58 are formed on the first surface 52 and the second surface 54, and then the coating layer 60 is formed on the second surface 24. The coating layer 60 may be formed after laminating the first substrate 14 and the second substrate 16. In the second substrate 16, an insulative filler 66 is filled in the center of the through hole 62.

Figure 2I:
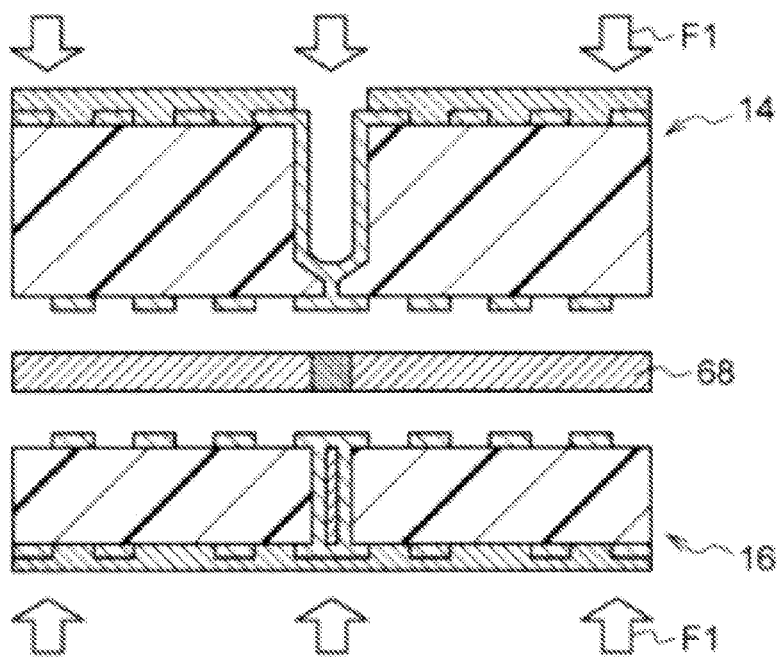

As illustrated in FIG. 2I, an adhesive sheet 68 is disposed between the second surface 24 of the first substrate 14 and the first surface 52 of the second substrate 16, and the first substrate 14 and the second substrate 16 are heated and pressed in directions of approaching each other as illustrated by an arrow F1. Therefore, the laminated substrate 12 illustrated in FIG. 1A may be obtained.

The through hole 32 of the first substrate 14 (the single-layered substrate 18) has a large diameter hole 34 and a small diameter hole 36 communicating with the large diameter hole 34. Since the through hole 32 has the small diameter hole 36, when a portion of the through hole 32 is blocked by the plating, the small diameter hole 36 is blocked to form the blocking portion 42, but the large diameter hole 34 may not be blocked. Since the plating thickness may be sufficient only if the small diameter hole 36 is blocked, the plating thicknesses of the metal films 38 formed on the first surface 22 and the second surface 24 of the first substrate 14 may be reduced.

Since the metal films 38 formed on the first surface 22 and the second surface 24 of the first substrate 14 are thin, the time required for plating only the small diameter hole 36 may be shorter than the time required for blocking the entire through hole 32 by the plating.

When the metal films 38 formed on the first surface 22 and the second surface 24 are thin, the wiring patterns formed using the metal films 38 may be made finer.

Since the wiring patterns 26 and 28 are formed on the metal films 38 having a small thickness, for example, the metal films 38 except for the wiring patterns 26 and 28 may be easily removed and the wiring patterns 26 and 28 may be easily formed.

Since the thickness of the metal films 38 of the first substrate 14 is reduced in the laminated substrate 12, the wiring patterns 26 and 28 of the laminated substrate 12 may be made finer.

Since thick plating is not performed on the first substrate 14, variation in plating thickness may be suppressed. Since the plating thicknesses of the first surface 22 and the second surface 24 of the first substrate 14 are reduced, a process of reducing the thicknesses of plating films may not be performed using, for example, etching, once the plating films are formed.

The coating portion 40 is formed on the inner surface of the large diameter hole 34 while the small diameter hole 36 of the through hole 32 is blocked by the blocking portion 42, but the large diameter hole 34 may not be blocked. Since the large diameter hole 34 is not blocked, so that, as illustrated in FIG. 1A, the connector 44 is inserted into the large diameter hole 34 and the connector 44 and the coating portion 40 are electrically connected to each other. For example, when the wide-width portion 44B of the connector 44 comes in close contact with the coating portion 40, the connector 44 is suppressed from being loosened from the large diameter hole 34 and the electrical coupled state between the connector 44 and the coating portion 40 may be maintained.

The blocking portion 42, the coating portion 30, and the metal films 38 may be formed by performing the plating on the first substrate one time. Therefore, as compared with a method in which the blocking portion 42, the coating portion 30, and the metal film 38 are formed by performing the plating plural (separate) times, the first substrate 14 (the laminated substrate 12) may be easily manufactured.

As illustrated in FIGS. 1A and 2I, the adhesive sheet 68 is disposed between the first substrate 14 and the second substrate 16. As compared with a method in which the adhesive sheet 68 is not disposed between the first substrate 14 and the second substrate 16, the adhesive strength between the first substrate 14 and the second substrate 16 may be increased. Since the small diameter hole 36 of the first substrate 14, for example, the second surface 24 side hole with which the adhesive sheet 68 is in contact is blocked by the blocking portion 42, a portion of the adhesive sheet 68 or the conductive material 70 may not be inadvertently inserted into the through hole 32.

The shape of a horizontal section (a cross-section in a horizontal direction in FIG. 1A) of the large diameter hole 34 may be a circular shape and the shape of a cross-section of the small diameter hole 36 may also be a circular shape. For example, the shape of a horizontal section of the through hole 32 may be a circular shape. The shape of the cross-section of the through hole 32 may be a circular shape or any other shape. When the shape of the cross-section of the through hole 32 is a circular shape, as illustrated in FIG. 2A, the large diameter hole 34 and the small diameter hole 36 may be formed using a drill For example, since the large diameter hole 34 is not blocked by the plating, an insulative resin may not be buried in a location of the large diameter hole 34. When the large diameter hole 34 is blocked by the plating, the plated metal is gradually grown from the inner surface of the large diameter hole 34 to the center so that a void (bubble or remaining plating liquid) may be formed at the central portion. However, since the large diameter hole 34 is not blocked by the plating, occurrence of the void may be suppressed. Since the occurrence of the void is reduced, another buried member, for example, an insulative resin may not be buried in the large diameter hole 34.

When the hole is formed in the large diameter hole using the drill in a structure of the large diameter hole which is blocked by the plating or a structure of the large diameter hole into which the buried member is buried, the drill is centered on the center of the large diameter hole which is already formed. In order to achieve an electrical connection with the connector in the large diameter hole, the buried member is completely cut out. For example, in the structure in which the large diameter hole is blocked by the plating or the structure in which the buried member is buried, a high positional precision may be required to form a hole using a drill or a processing time may be increased. Since a hole is not formed in the large diameter hole 34, in which the coating portion 40 is formed by the plating, using the drill, the first substrate may be easily manufactured or the processing time may be short.

The inner diameter D2 and the depth C2 of the small diameter hole 36 may be set such that when the first substrate 14 is plated, the large diameter hole 34 is not blocked by the plating and the small diameter hole 36 is blocked by the plating.

Figure 3:
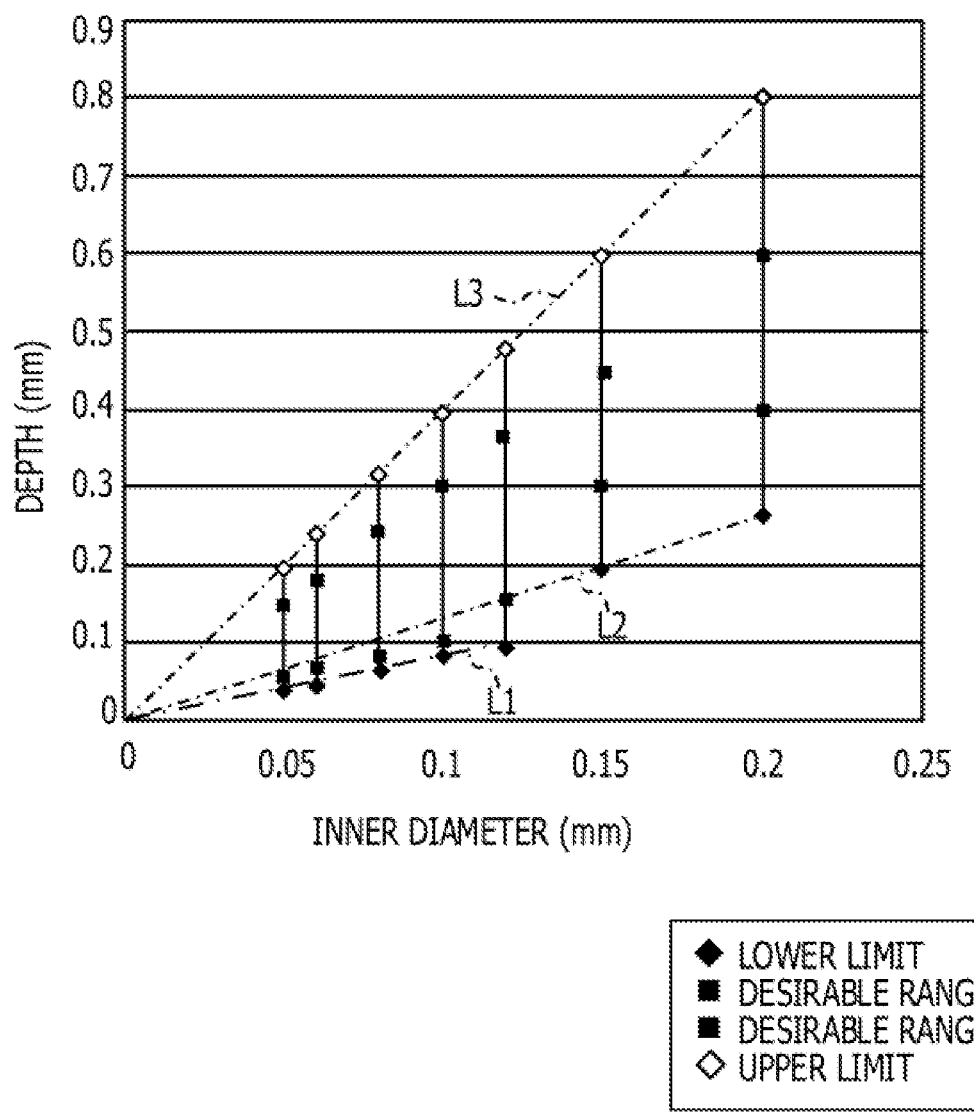
FIG. 3 illustrates an exemplary relationship between an inner diameter and a depth of a small diameter hole of a laminated substrate.

Table 1 represents a relationship between the inner diameter D2 and the depth C2 of the small diameter hole 36. Table 2 represents a relationship between the inner diameter D2 and an aspect ratio of the small diameter hole 36. FIG. 3 illustrates an exemplary relationship between an inner diameter and a depth of a small diameter hole of a laminated substrate. In FIG. 3, the relationship of the depth C2 with respect to the inner diameter D2 of the small diameter hole 36 is represented by an upper limit, a lower limit, and a desirable range when the small diameter hole 36 is blocked by the plating. The aspect ratio is a value obtained by dividing the depth C2 of the small diameter hole 36 by the inner diameter D2 of the small diameter hole 36. Therefore, as the aspect ratio becomes smaller, the small diameter hole 36 has a flat shape and as the aspect ratio becomes larger, the small diameter hole 36 is narrow and long. In the graph of FIG. 3, the lower and upper limits of the aspect ratio are represented as gradients of straight lines L1 and L2 and a gradient of the straight line L3, respectively.

TABLE 1

| Inner Diameter (φ) | Depth (mm) | | |
|---|---|---|---|
| | Lower Limit | Desirable Range | Upper Limit |
| 0.050 | 0.040 | 0.050   0.150 | 0.200 |
| 0.060 | 0.048 | 0.060   0.180 | 0.240 |
| 0.080 | 0.064 | 0.080   0.240 | 0.320 |
| 0.100 | 0.080 | 0.100   0.300 | 0.400 |
| 0.120 | 0.096 | 0.156   0.360 | 0.480 |
| 0.150 | 0.195 | 0.300   0.450 | 0.600 |
| 0.200 | 0.260 | 0.400   0.600 | 0.800 |

TABLE 2

| Inner Diameter (φ) | Aspect Ratio (Depth ÷ Inner diameter) | | |
|---|---|---|---|
| | Lower Limit | Desirable Range | Upper Limit |
| 0.050 | 0.8 | 1.0   3.0 | 4.0 |
| 0.060 | 0.8 | 1.0   3.0 | 4.0 |
| 0.080 | 0.8 | 1.0   3.0 | 4.0 |
| 0.100 | 0.8 | 1.0   3.0 | 4.0 |
| 0.120 | 0.8 | 1.3   3.0 | 4.0 |
| 0.150 | 1.3 | 2.0   3.0 | 4.0 |
| 0.200 | 1.3 | 2.0   3.0 | 4.0 |

Figure 4:
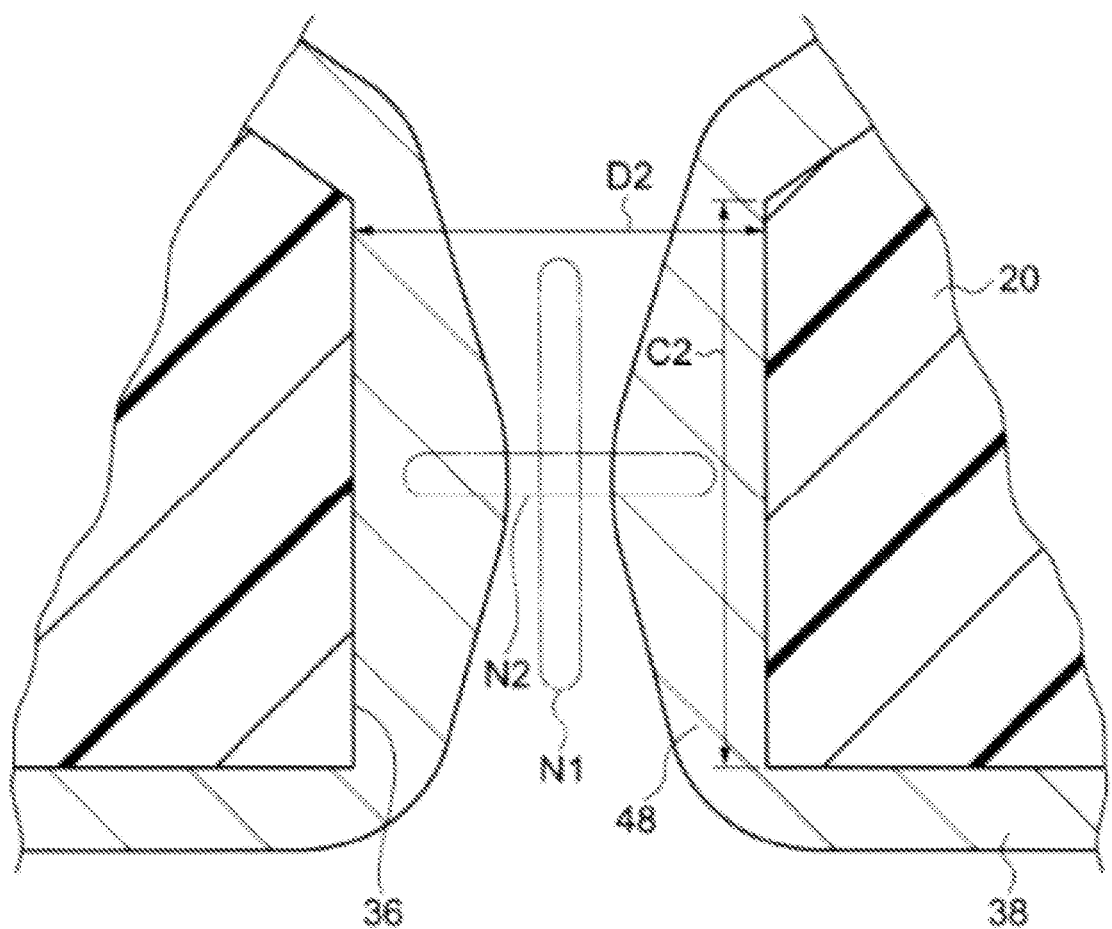
FIG. 4 illustrates an example of generating a blocking portion.

FIG. 4 illustrates an example of generating a blocking portion. In FIG. 4, in the small diameter hole 36, a process in which the blocking portion 42 is being formed by growth of a metal film 48 by plating is illustrated.

When the small diameter hole 36 is too flat, even though the plated metal is grown from the inner surface of the small diameter hole 36, the plated metal may be hard to reach the central portion N1 (the central portion of a circle when viewed from plan view in the direction indicated by arrow A1 of FIG. 1A) of the small diameter hole 36. For example, since the small diameter hole 36 is blocked by the plating, the metal film 48 may be thick or a void may be formed at the center portion N1. In Table 1, a value of a lower limit of the depth C2 of the small diameter hole 36 may be a value at which the plating is not excessively thick and the small diameter hole 36 is securely blocked.

When the small diameter hole 36 becomes excessively thin and long, a component of the plated metal may be hard to be inserted into the small diameter hole 36 or reach a center portion N2 in a depth direction. In Table 1, a value of an upper limit of the depth C2 of the small diameter hole 36 may be a value at which the plated metal satisfactorily expands to an inside of the small diameter hole 36, for example, the central portion N2 in the depth direction.

In Table 1, a desirable range of the depth may be a desirable range in terms of the fact that the plated metal is not excessively thick and the small diameter hole 36 may be securely blocked.

Based on Table 2 and the graph of FIG. 3, when the inner diameter of the small diameter hole 36 is 0.05 mm or larger and 0.12 mm or smaller, the lower limit of the aspect ratio may be 0.8. When the inner diameter of the small diameter hole 36 is larger than 0.12 mm and 0.20 mm or smaller, the lower limit of the aspect ratio may be 1.3. When the inner diameter of the small diameter hole 36 is 0.05 mm or larger and 0.10 mm or smaller, the lower limit of the desirable range of the aspect ratio may be 1.0, when the inner diameter of the small diameter hole 36 is larger than 0.10 mm and 0.15 mm or smaller, the lower limit of the desirable range of the aspect ratio may be 1.3, and when the inner diameter of the small diameter hole 36 is larger than 0.15 mm and 0.20 mm or smaller, the lower limit of the desirable range of the aspect ratio may be 2.0. For example, when the inner diameter of the small diameter hole 36 is small, even though the aspect ratio is small, the small diameter hole 36 may be blocked by plating. When the inner diameter of the small diameter hole 36 is small, a difference may be easily caused between the flow rate in plating on a surface (for example, the second surface 24) of the base material 20 and the flow rate in plating inside the small diameter hole 36.

When the inner diameter of the small diameter hole 36 is 0.05 mm or larger and 0.20 mm or smaller, the upper limit of the aspect ratio may be 4.0 and may preferably be 3.0.

A cylindrical portion 34A and a conical portion 34B are formed as the large diameter hole 34. The cylindrical portion 34A of the large diameter hole 34 has a substantially constant inner diameter in a depth direction. Therefore, as compared with a hole whose inner diameter becomes wider toward the first surface 22, the wide-width portion 44B of the connector 44 (see FIG. 1A) may securely come in close contact so that the connector 44 may be suppressed from being loosened.

The cylindrical portion 34A of the large diameter hole 34 is coated with the coating portion 40. Therefore, a portion of the connector 44 is in contact with a portion of the coating portion 40 so that the connector 44 and the coating portion 40 are electrically coupled with each other. For example, in a structure illustrated in FIG. 1A, the coating portion 40 is continuous with the wiring patterns 26 and 28 of the first surface 22 so as to provide a structure in which the connector 44 and the wiring patterns 26 and 28 on the first surface 22 are electrically coupled.

As illustrated in FIG. 1A, the coating portion 40 and the blocking portion 42 are continuous with each other. Therefore, the connector 44 is in contact with a portion of the coating portion 40 so that the connector 44 and the blocking portion 42 are electrically coupled to each other through the coating portion 40. In FIG. 1A, the blocking portion 42 is continuous with the wiring patterns 56 and 58 on the second surface 24 so as to provide a structure in which the connector 44 and the wiring patterns 56 and 58 of the second surface 24 are electrically coupled.

Since the coating portion 40 is continuous with the wiring patterns 26 and 28 on the first surface 22, the wiring pattern 26 of the first surface 22 is electrically connected with the wiring pattern 28 of the second surface 24 through the coating portion 40 and the blocking portion 42.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a laminated substrate, the method comprising:
   forming a first diameter hole to a first surface of a first substrate so as not to penetrate the first substrate;
   forming a second diameter hole to a second surface of the first substrate so as to communicate with the first diameter hole;
   plating the first substrate to block the second diameter hole without blocking the first diameter hole; and
   laminating a second substrate on the second surface of the first substrate,
   wherein the blocking of the second diameter hole, coating of an inner surface of the first diameter hole, and forming of a film on the first surface of the first substrate are performed by performing the plating one time.

2. The method according to claim 1, wherein a diameter of the second diameter hole is smaller than a diameter of the first diameter hole.

3. The method according to claim 1, wherein an adhesive sheet is disposed between the first substrate and the second substrate to bond the first substrate and the second substrate.

4. The method according to claim 1, wherein a wiring pattern is formed on the film.

5. The method according to claim 1, wherein a circular hole having a circular cross-section is formed as the second diameter hole.

6. The method according to claim 5, wherein the circular hole has an inner diameter of 0.05 mm or larger and 0.12 mm or smaller, and a ratio of a depth of the circular hole with respect to the inner diameter in the circular hole is 0.8 or larger and 4.0 or smaller.

7. The method according to claim 5, wherein the circular hole has an inner diameter which is larger than 0.12 mm and 0.20 mm or smaller, and a ratio of a depth of the circular hole with respect to the inner diameter in the circular hole is 1.3 or larger and 4.0 or smaller.

8. The method according to claim 1, wherein a cylindrical portion having a constant diameter along a length direction is formed in the first diameter hole.

9. A method of manufacturing a laminated substrate, the method comprising:
   forming a first diameter hole to a first surface of a first substrate so as not to penetrate the first substrate;
   forming a second diameter hole to a second surface of the first substrate so as to communicate with the first diameter hole;
   plating the first substrate to block the second diameter hole without blocking the first diameter hole; and
   laminating a second substrate on the second surface of the first substrate,
   wherein an adhesive sheet is disposed between the first substrate and the second substrate to bond the first substrate and the second substrate.

10. A laminated substrate comprising:
    a first substrate including a large diameter hole formed to a first surface, a small diameter hole formed to a second surface and having a diameter which is smaller than that of the large diameter hole, and a conductive blocking portion which blocks the small diameter hole;
a second substrate laminated on the second surface of the first substrate; and
an adhesive sheet disposed between the first substrate and the second substrate to bond the first substrate and the second substrate.

11. The laminated substrate according to claim 10, further comprising:
a conductive coating portion configured to cover an inner surface of the large diameter hole.

12. The laminated substrate according to claim 11, wherein the blocking portion and the coating portion are continuous with each other.

13. The laminated substrate according to claim 10, wherein the small diameter hole has a circular cross-section.

14. The laminated substrate according to claim 10, further comprising:
a cylindrical portion provided in the first diameter hole and having a constant diameter along a length direction from a bottom portion of the first diameter hole to an opening of the first diameter hole.

15. The laminated substrate according to claim 10, further comprising:
a through hole provided in the second substrate so as to oppose the small diameter hole.

16. The laminated substrate according to claim 10, further comprising:
a conductive coating portion configured to cover an inner surface of the large diameter hole entirely and extend to an outside of the large diameter hole continuously.

* * * * *